(12) United States Patent  (10) Patent No.: US 12,374,293 B2
Kim                       (45) Date of Patent:     Jul. 29, 2025

(54) DISPLAY PANEL

(71) Applicant: LG Display Co., Ltd., Seoul (KR)

(72) Inventor: KyungSu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/464,059

(22) Filed: Sep. 8, 2023

(65) Prior Publication Data

US 2024/0090264 A1    Mar. 14, 2024

(30) Foreign Application Priority Data

Sep. 14, 2022   (KR) .................. 10-2022-0115315

(51) Int. Cl.
  *G09G 3/3266*   (2016.01)
  *H10D 30/67*    (2025.01)
  (Continued)

(52) U.S. Cl.
  CPC .......... *G09G 3/3266* (2013.01); *H10D 30/67* (2025.01); *H10D 30/6723* (2025.01);
  (Continued)

(58) Field of Classification Search
  CPC ......... H01L 29/78633; H01L 27/1225; H01L 27/1251; H01L 29/786; G06F 3/041; G09G 3/2074; G09G 3/30; G09G 3/3208; G09G 3/3233; G09G 3/3266; G09G 3/3275; G09G 2300/0426; G09G 2300/0819; G09G 2300/0842; G09G 2300/0861; G09G 2310/0202; G09G 2310/0243; G09G 2310/0264; G09G 2310/0281; G09G 2310/0286; G09G 2310/08; G09G 2320/0233; G09G 2320/0626;
  (Continued)

(56) References Cited

U.S. PATENT DOCUMENTS

2020/0152800 A1 *  5/2020  Zhou ................ H01L 29/78678
2021/0408061 A1 * 12/2021  Shin ........................ G09G 3/20
(Continued)

FOREIGN PATENT DOCUMENTS

KR   10-2017-0061531 A     6/2017
KR      20170061531 A  *   6/2017
(Continued)

OTHER PUBLICATIONS

Korean Intellectual Property Office, Office Action, Korean Patent Application No. 10-2022-0115315, Feb. 17, 2025, 14 pages.

*Primary Examiner* — Julie Anne Watko
(74) *Attorney, Agent, or Firm* — Fenwick & West LLP

(57) ABSTRACT

A display panel that may reduce a bezel area is provided. In the display panel, a scan driver includes an inverter that inverts a carry signal generated from an input signal to output a scan signal, and the inverter includes a first transistor including a polysilicon semiconductor layer; and a second transistor including an oxide semiconductor layer, disposed to overlap the first transistor in a thickness direction of the display panel, and a gate electrode of the first transistor and a gate electrode of the second transistor, which overlap each other in the thickness direction, are electrically connected to each other to constitute a common gate electrode that receives the carry signal.

27 Claims, 8 Drawing Sheets

(51) Int. Cl.
*H10D 86/40* (2025.01)
*H10D 86/60* (2025.01)
*H10K 59/121* (2023.01)
*H10K 59/124* (2023.01)
*H10K 59/126* (2023.01)
*H10K 59/131* (2023.01)
*G09G 3/30* (2006.01)
*G09G 3/3208* (2016.01)
*G09G 3/3233* (2016.01)

(52) U.S. Cl.
CPC .......... *H10D 86/471* (2025.01); *H10D 86/60* (2025.01); *H10K 59/121* (2023.02); *H10K 59/1213* (2023.02); *H10K 59/124* (2023.02); *H10K 59/131* (2023.02); *G09G 3/30* (2013.01); *G09G 3/3208* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/0202* (2013.01); *G09G 2310/0281* (2013.01); *G09G 2310/0286* (2013.01); *G09G 2310/08* (2013.01); *H10D 86/423* (2025.01); *H10K 59/126* (2023.02)

(58) Field of Classification Search
CPC .......... G09G 2330/021; H10K 59/121; H10K 59/1213; H10K 59/1216; H10K 59/124; H10K 59/126; H10K 59/131; H10D 30/67; H10D 30/6723; H10D 86/60; H10D 86/471; H10D 86/423
See application file for complete search history.

(56) References Cited

U.S. PATENT DOCUMENTS

2022/0208911 A1\* 6/2022 Cho .................... H10K 59/1213
2023/0115779 A1\* 4/2023 Kim ........................ G09G 3/32
345/55

FOREIGN PATENT DOCUMENTS

| KR | 10-2020-0080056 A | | 7/2020 |
|---|---|---|---|
| KR | 20200080056 A | \* | 7/2020 |
| WO | WO-2022043826 A1 | \* | 3/2022 |

\* cited by examiner

DISPLAY PANEL

CROSS-REFERENCE TO RELATED APPLICATION

This application claims the benefit of and the priority to Republic of Korea Patent Application No. 10-2022-0115315 filed on Sep. 14, 2022, the contents of which are herein incorporated by reference in their entirety.

BACKGROUND

Technical Field

The present disclosure relates to a display panel that may reduce a bezel area.

Discussion of the Related Art

A light emitting display device uses a self-light emitting element for allowing an organic light emitting layer to emit light by recombination of electrons and holes, and thus has advantages of high luminance, a low driving voltage and an ultra-thin film and may be implemented in a free shape.

The light emitting display device includes a display panel that displays an image through a pixel matrix and a driving circuit that drives the display panel. Each of pixels constituting a pixel matrix is independently driven by a plurality of thin film transistors (TFTs).

A gate driver for controlling the transistors of the pixels may be disposed in a bezel area of the display panel. Since the gate driver includes a plurality of scan drivers that control a switching transistor of each pixel and a light emission control driver that controls a light emission control transistor, the bezel area may be increased.

The disclosure of the above-described background art is owned by the inventor of the present disclosure to devise the present disclosure or is technical information acquired by a process of devising the present disclosure, but may not be regarded as the known art disclosed to the general public before the present disclosure is disclosed.

SUMMARY

The present disclosure is directed to a display panel that substantially obviates one or more of the problems due to limitations and disadvantages of the related art.

An aspect of one or more embodiments of the present disclosure is to provide a display panel that may reduce a bezel area.

Additional features and aspects of the present disclosure will be set forth in the description that follows and in part will become apparent from the description or may be learned by practice of the inventive concepts provided herein. Other features and aspects of the inventive concepts may be realized and attained by the structure particularly pointed out in, or derivable from, the written description, claims hereof, and the appended drawings.

To achieve these objects and other advantages of the present disclosure, as embodied and broadly described herein, a display panel may comprise: a display area in which a plurality of subpixels are disposed, a bezel area surrounding the display area, and a scan driver disposed in the bezel area, supplying a scan signal to at least one gate line connected to each of the plurality of subpixels, wherein the scan driver includes an inverter that inverts a carry signal generated from an input signal to output the scan signal. The inverter according to some embodiments includes a first transistor including a polysilicon semiconductor layer; and a second transistor including an oxide semiconductor layer, disposed to overlap the first transistor in a thickness direction of the display panel, and a gate electrode of the first transistor and a gate electrode of the second transistor, which overlap each other in the thickness direction, are connected to each other to constitute a common gate electrode that receives the carry signal.

In accordance with another aspect of the present disclosure, a display panel may comprise: a display area in which a plurality of subpixels are disposed, a first scan driver disposed in a bezel area, supplying a first scan signal to each of a plurality of first gate lines connected to the plurality of subpixels, a second scan driver disposed in the bezel area, supplying a second scan signal to each of a plurality of second gate lines connected to the plurality of subpixels, and a light emission control driver disposed in the bezel area, supplying a light emission control signal to each of a plurality of third gate lines connected to the plurality of subpixels, wherein at least one of the first and second scan drivers includes an inverter that inverts a carry signal generated from an input signal to output a corresponding scan signal. The inverter according to some embodiments includes a first transistor including a polysilicon semiconductor layer, and a second transistor including an oxide semiconductor layer, disposed to overlap the first transistor in a thickness direction of the display panel.

In one embodiment, a display panel includes a substrate, a light emitting element of at least one pixel on the substrate in a display area of the substrate, and a first semiconductor layer of a first transistor of an inverter on the substrate. The inverter is disposed in a gate driver area of the substrate. The display panel also includes a first gate insulating layer on the first semiconductor layer of the first transistor of the inverter, a first gate electrode of the first transistor of the inverter on the first gate insulating layer, an interlayer insulating layer on the first gate electrode of the first transistor, and a second gate electrode of a second transistor of the inverter on the interlayer insulating layer. The first gate electrode of the first transistor and the second gate electrode of the second transistor are electrically connected to each other. The display panel further includes a buffer layer on the second gate electrode of the inverter, a second semiconductor layer of the second transistor of the inverter and a third semiconductor layer of a third transistor of the at least one pixel on the buffer layer, a second gate insulating layer on the second semiconductor layer and the third semiconductor layer, and a third gate electrode of the third transistor on the second gate insulating layer.

It is to be understood that both the foregoing general description and the following detailed description of the present disclosure are by way of example and are intended to provide further explanation of the disclosures as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1A:
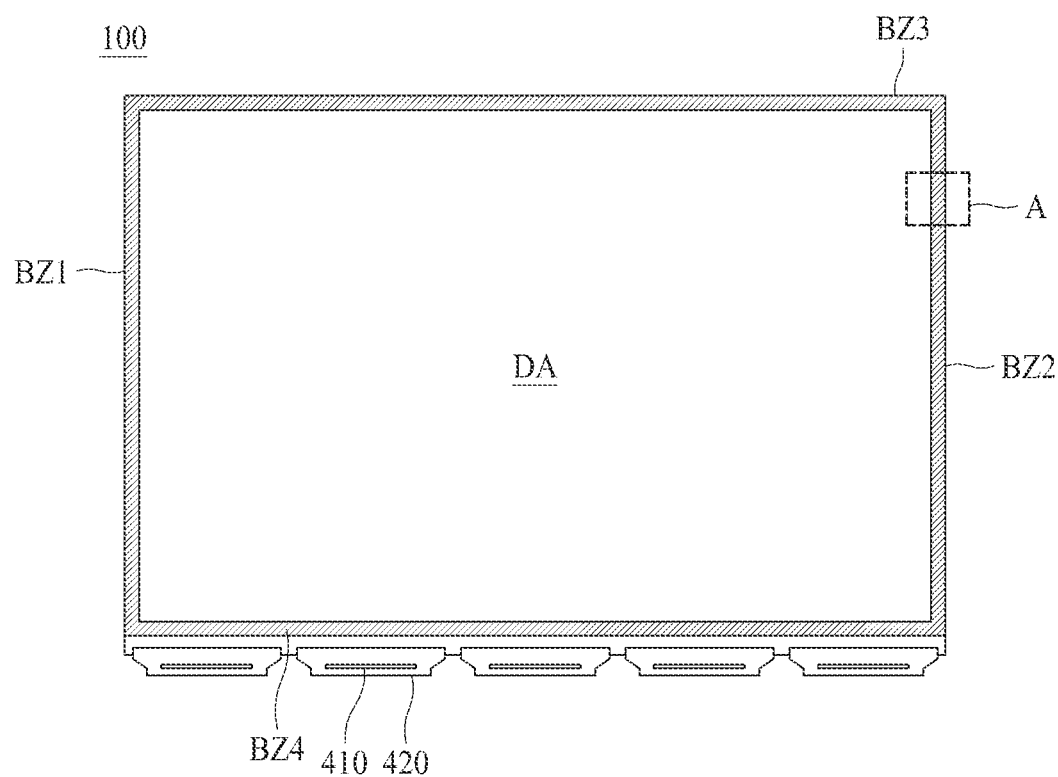
FIGS. 1A and 1B are block views illustrating a configuration of a display device according to one embodiment of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only' is used. The terms of a singular form can include plural forms unless referred to the contrary.

In construing an element, the element is construed as including an error range although there is no explicit description.

In describing a position relationship, for example, when a position relation between two parts is described as "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case which is not continuous can be included unless a more limiting term, such as "just," "immediate(ly)," or "direct(ly)" is used.

It will be understood that, although the terms "first," "second," etc., can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., can be used. These terms are intended to identify the corresponding elements from the other elements, and basis, order, or number of the corresponding elements should not be limited by these terms. As for the expression that an element or a layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various aspects of the present disclosure can be partially or overall coupled to or combined with each other, and can be variously inter-operated with each other and driven technically as those skilled in the art can sufficiently understand. The aspects of the present disclosure can be carried out independently from each other, or can be carried out together in co-dependent relationship.

Hereinafter, the aspect of the present disclosure will be described with reference to the accompanying drawings. Since a scale of each of elements shown in the accompanying drawings is different from an actual scale for convenience of description, the present disclosure is not limited to the shown scale. Further, all the components of each display device according to all embodiments of the present disclosure are operatively coupled and configured.

Figure 1B:
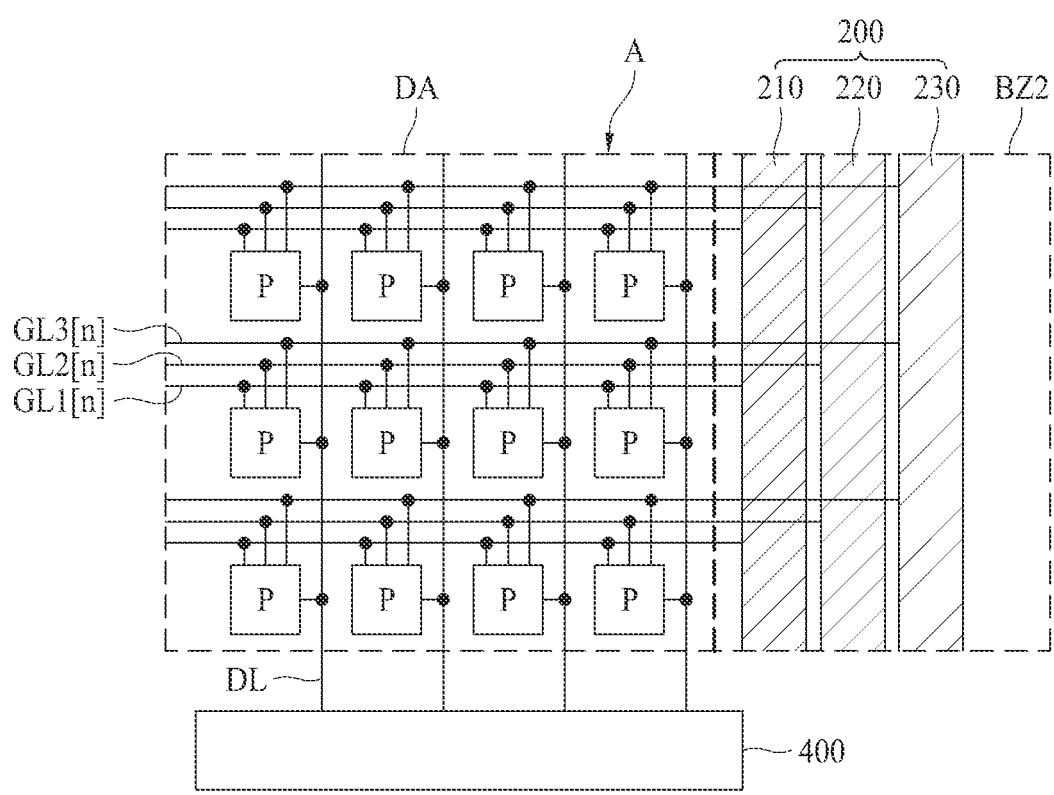

FIG. 1A is a schematic block view illustrating a configuration of a display device according to one embodiment of the present disclosure, and FIG. 1B is an enlarged view of an area A shown in FIG. 1AB.

The display device according to one embodiment may be an organic light emitting diode (OLED) display device, a quantum-dot light emitting diode display device, or an electroluminescent display device including an inorganic light emitting diode display device. The display device according to one embodiment may be a micro light emitting diode display device.

Referring to FIGS. 1A and 1B, the display device may include a display panel 100, a gate driver 200 embedded in the display panel 100, and a data driver 400 connected to the display panel 100.

The display panel 100 displays an image through a display area DA in which a plurality of subpixels are arranged in the form of a matrix. The subpixel P may be any one of a red subpixel for emitting red light, a green subpixel for emitting green light, a blue subpixel for emitting blue light and a white subpixel for emitting white light. The unit pixel may include at least two subpixels having different emission colors. Each of the subpixels may include a pixel circuit comprised of a light emitting element and a plurality of transistors for independently driving the light emitting element. A plurality of signal lines, which include a data line DL, gate lines GL1[n], GL2[n] and GL3[n] (n is a natural number), and a power line and other signal lines and are connected to each subpixel P, may be disposed in the display panel 100.

The display panel 100 according to one embodiment may further include a touch sensor screen disposed in the display area DA to sense a user's touch.

The display panel 100 according to one embodiment may be a touch display panel in which a touch sensor array is embedded. For example, the display panel 100 according to one embodiment may include a pixel array including a circuit element layer including a plurality of transistors disposed on a substrate and a light emitting element layer including a plurality of light emitting elements disposed on the circuit element layer; an encapsulation layer disposed on the pixel array to seal the light emitting element layer; and a touch sensor array including a plurality of touch electrodes disposed on the encapsulation layer. The display panel 100 according to one embodiment may further include an optical film, an optical clear adhesive (OCA), a cover substrate, a protective film and the like, which are sequentially disposed on the touch sensor array. The display panel 100 according to one embodiment may further include a color filter array disposed between the touch sensor array and the optical film, including a color filter and a black matrix.

The gate driver 200 surrounds the display area DA in the display panel 100, and may be disposed in at least one of bezel areas BZ1 and BZ2 positioned at an outer portion. For example, the gate driver 200 may be disposed in any one of first and second bezel areas BZ1 and BZ2 facing each other with the display area DA interposed therebetween, or may be disposed on both sides of the first and second bezel areas BZ1 and BZ2. The gate driver 200 may be disposed in a Gate In Panel (GIP) type made of TFTs formed by the same process as that of TFTs disposed in the display area DA.

The gate driver 200 may include a scan driver 210 for driving the gate line GL1[n] connected to the subpixels P of each pixel line, a scan driver 220 for driving the gate line GL2[n] connected to the subpixels P of each pixel line, and a light emission control driver 230 for driving the gate line GL3[n] connected to the subpixels P of each pixel line.

The number of gate lines connected to the subpixels P of each pixel line, the number of scan drivers and the number of light emission control drivers are not limited to those shown in FIG. 1, and may be variously changed depending on a detailed configuration of the pixel circuit constituting each subpixel P.

Each of the plurality of scan drivers 210 and 220 and the light emission control driver 230 may operate by receiving a gate control signal supplied from a timing controller through a level shifter.

The scan driver 210 may include a plurality of first scan stages for supplying a first scan signal to the gate line GL1[n] of each of the plurality of pixel lines.

The scan driver 220 may include a plurality of second scan stages for supplying a second scan signal to the gate line GL2[n] of each of the plurality of pixel lines.

The light emission control driver 230 may include a plurality of light emission control stages for supplying a light emission control signal to the gate line GL3[n] (or the light emission control line) of each of the plurality of pixel lines.

The data driver 400 may convert digital data supplied from the timing controller into an analog data signal to supply each data voltage to each data line DL of the display panel 100. The data driver 400 may convert the digital data into an analog data voltage by using gray scale voltages in which a plurality of reference gamma voltages supplied from a gamma voltage generator are subdivided.

The data driver 400 may include at least one data drive integrated circuit (IC) 410 for driving a plurality of data lines DL disposed in the display panel 100. Each data drive IC 410 may be individually packaged on each circuit film 420. The circuit film 420 on which the data drive IC 410 is packaged may be bonded to a bezel area BZ4, in which a pad area of the display panel 100 is disposed, through an anisotropic conductive film (ACF). The circuit film 420 may be any one of a chip on film (COF), a flexible printed circuit (FPC) and a flexible flat cable (FFC).

At least one of a low temperature poly silicon (LTPS) transistor that uses an LTPS semiconductor or an oxide transistor that uses a metal-oxide semiconductor may be applied to the plurality of transistors disposed in the display area DA of the display panel 100 and the bezel areas BZ1 to BZ4 including the gate driver 200.

For example, the display panel 100 may be configured such that the LTPS transistor and the oxide transistor coexist in order to reduce power consumption.

In the display panel 100 according to one embodiment, a plurality of transistors constituting a pixel circuit of each subpixel P may include both a P-type LTPS transistor and an N-type oxide transistor. A plurality of transistors constituting the gate driver 200 in the display panel 100 may include both a P-type LTPS transistor and an N-type oxide transistor. A detailed description of the transistors will be given below with reference to FIGS. 2 to 4.

The light emission control driver 230 may output a negative pulse type light emission control signal for swinging a gate high voltage corresponding to a gate-off voltage and a gate low voltage corresponding to a gate-on voltage so as to drive the P-type LTPS transistor.

At least one of the plurality of scan drivers 210 and 220 may output a negative pulse type scan signal for swinging a gate high voltage and a gate low voltage to drive the P-type LTPS transistor.

At least one of the plurality of scan drivers 210 and 220 may output a positive pulse type scan signal for swing a gate low voltage corresponding to the gate-off voltage and a gate high voltage corresponding to the gate-on voltage in order to drive the N-type oxide transistor.

To this end, at least one of the plurality of scan drivers 210 and 220 may further include an inverter for inverting a negative pulse type carry signal to output the positive pulse type scan signal in each stage.

The inverter according to one embodiment of the present disclosure may be made a complementary metal-oxide semiconductor (CMOS) transistor in which one positive MOS (PMOS) transistor and one NMOS transistor share an output line with a gate electrode, thereby reducing a circuit configuration and a circuit area.

Particularly, the inverter according to one embodiment may include a P-type LTPS transistor and an N-type oxide transistor, which share a gate electrode and an output line, and the P-type LTPS transistor and the N-type oxide transistor may be disposed to overlap each other in a thickness direction of the display panel 100. A detailed description of these transistors will be given later with reference to FIGS. 4 to 7.

Therefore, since the circuit configuration and the circuit area of the inverter according to one embodiment and a circuit area of the gate driver 200 including the inverter may be reduced, a narrow bezel may be implemented by reducing widths of the bezel areas BZ1 and BZ2 of the display panel 100.

Figure 2:
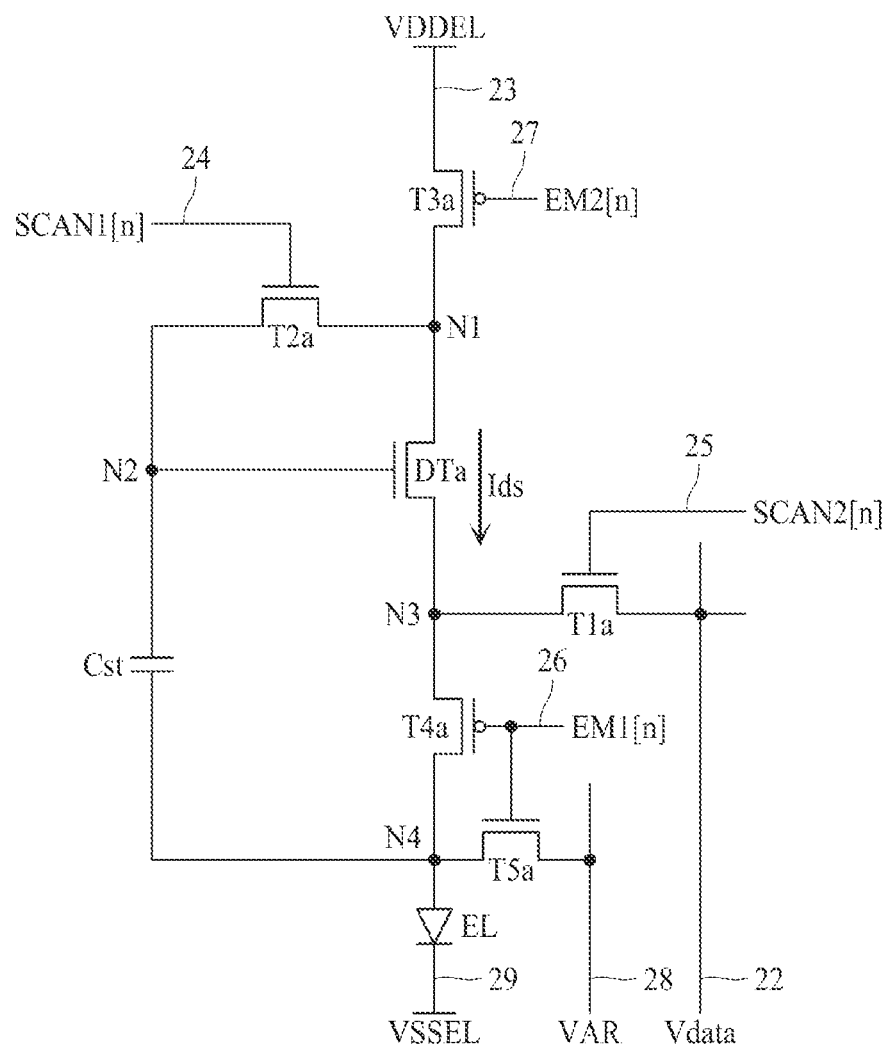
FIG. 2 is an equivalent circuit view illustrating a configuration of a pixel circuit of a subpixel according to one embodiment of the present disclosure.

FIG. 2 is an equivalent circuit view illustrating a configuration of a pixel circuit of a subpixel according to one embodiment.

Referring to FIG. 2, a pixel circuit 10A of a subpixel according to one embodiment may have a 6T1C (six transistors and one capacitor) structure that includes a light emitting element EL, a driving transistor DTa, a switching transistor T1*a*, a compensation transistor T2*a*, an operation control transistor T3*a*, a light emission control transistor T4*a*, an initialization transistor T5*a* and a storage capacitor Cst. The switching transistor T1*a*, the compensation transistor T2*a*, the operation control transistor T3*a*, the light emission control transistor T4*a* and the initialization transistor T5*a* may be represented as first to fifth switching transistors T1*a* to T5*a*.

Each of the driving transistor DTa, the switching transistor T1*a*, the compensation transistor T2*a*, the operation control transistor T3*a*, the light emission control transistor T4*a* and the initialization transistor T5*a* includes a gate electrode, a source electrode and a drain electrode. Since the source electrode and the drain electrode may be changed depending on a direction of a voltage and a current, which are applied to the gate electrode, without being fixed, one of the source electrode and the drain electrode is represented as a first electrode and the other one is represented as a second electrode.

The plurality of transistors DTa and T1*a* to T5*a* constituting the pixel circuit 10A of the subpixel according to one embodiment may include an LTPS transistor and an oxide transistor.

For example, the operation control transistor T3*a* and the light emission control transistor T4*a* may be made of a P-type LTPS transistor having fast mobility. The driving transistor DT, the switching transistor T1*a*, the compensation transistor T2*a* and the initialization transistor T5*a* may be made of N-type oxide transistors having a smaller leakage current than the LTPS transistor.

The pixel circuit 10A according to one embodiment may be connected to first to fourth gate lines 24, 25, 26 and 27, a data line 22, first and second power lines 23 and 29 and an initialization line 28, which are disposed in the display panel (100 of FIG. 1).

A light emitting element EL may include an anode connected to the first electrode of the driving transistor DTa through the light emission control transistor T4*a*, a cathode connected to the second power line 29 for supplying a second power voltage VSSEL, and an organic light emitting layer between the anode and the cathode. The anode may be independent for each subpixel but the cathode may be a common electrode that is shared by the entire subpixels. When a driving current is supplied from the driving transistor DTa, electrons from the cathode are injected into the organic light emitting layer, holes from the anode are injected into the organic light emitting layer, and the electrons and the holes are recombined in the organic light emitting layer so that the organic light emitting layer emits light of a fluorescent or phosphorescent material, thereby generating light of luminance proportional to a current value of the driving current.

The compensation transistor T2*a* may be controlled by the first gate line 24, and may connect a second node N2 connected to the gate electrode of the driving transistor DTa with a first node N1 connected to the second electrode of the driving transistor DTa. The compensation transistor T2*a* may be turned on by a gate-on voltage of a first scan signal SCAN1[*n*] supplied through the first gate line 24 to connect the gate electrode with the second electrode of the driving transistor DTa, thereby connecting the driving transistor DTa in a diode structure.

The switching transistor T1*a* may be controlled by the second gate line 25, and may connect the data line 22 with a third node N3 connected to the first electrode of the driving transistor DTa. The switching transistor T1*a* may be turned on by a gate-on voltage of a second scan signal SCAN2[*n*] supplied through the second gate line 25 to supply the data voltage Vdata supplied through the data line 22 to the first electrode of the driving transistor DTa.

The operation control transistor T3*a* may be controlled by the fourth gate line 27, and may connect a first power line 23 with the first node N1 connected to the second electrode of the driving transistor DTa. The operation control transistor T3*a* may be turned on by a gate-on voltage of a second light emission control signal EM2[*n*] supplied through the fourth gate line 27 to supply the first power supply voltage VDDEL supplied through the first power line 23 to the second electrode of the driving transistor DTa.

The light emission control transistor T4*a* may be controlled by the third gate line 26, and may connect the third node N3 connected to the first electrode of the driving transistor DTa with a fourth node N4 connected to an anode electrode of a light emitting element EL. The light emission control transistor T4*a* may be turned on by a low voltage level of the second light emission control signal EM2[*n*] supplied through the third gate line 26 to connect the first electrode of the driving transistor DTa with the anode electrode of the light emitting element EL.

The initialization transistor T5*a* may be controlled by the third gate line 26, and may connect the initialization line 28 with the fourth node N4 connected to the anode of the light emitting element EL. The initialization transistor T5*a* may be turned on by a high voltage level of the second light emission control signal EM2[*n*] supplied through the third gate line 26 to initialize (reset) the fourth node N4 connected to the anode electrode of the light emitting element EL to an initialization voltage VAR (or anode reset voltage) supplied through the initialization line 28.

The P-type light emission control transistor T4*a* and the N-type initialization transistor T5*a*, which are connected to the third gate line 26, may perform switching operations opposite to each other by the second light mission control signal EM2[*n*].

The storage capacitor Cst may be connected between the second node N2 connected to the gate electrode of the driving transistor DTa and the fourth node N4 connected to the anode of the light emitting element EL. The storage capacitor Cst may be charged to a target voltage with a differential voltage between the first power voltage VDDEL in which a threshold voltage Vth of the driving transistor DTa is compensated, which is supplied to the second node N1, and the data voltage Vdata supplied to the fourth node N4, and may provide the charged target voltage as a driving voltage of the driving transistor DT. Therefore, a characteristic deviation of the driving transistor DTa between the subpixels may be compensated.

The driving transistor DTa may control light emission intensity of the light emitting element EL by controlling a current Ids flowing to the light emitting element EL in accordance with the driving voltage charged in the storage capacitor Cst.

Referring to FIGS. 1 and 2, the first scan driver 210 may supply the first scan signal SCAN1[*n*] to the first gate line 24, and the second scan driver 220 may supply the second scan signal SCAN2[*n*] to the second gate line 25. The light emission control driver 230 may include a first light emission control driver for supplying the first light emission control signal EM1[*n*] to the third gate line 26, and a second light emission control driver for supplying the second light emission control signal EM2[*n*] to the fourth gate line 27. The data driver 400 may supply the data voltage Vdata to the data line 22. A power management circuit may supply the first power voltage VDDEL to the first power line 23, may supply the second power voltage VSSEL to the second power line 29, and may supply the initialization voltage VAR to the initialization line 28.

The operation control transistor T3a and the light emission control transistor T4a, which are made of P-type LTPS transistors, are turned on by the gate low voltage of each of the light emission control signals EM2[n] and EM1[n], and are turned off by the gate high voltage thereof. The light emission control driver 230 may generate negative pulse type light emission control signals EM1[n] and EM2[n], respectively and supply the generated light emission control signals EM1[n] and EM2[n] to the gate lines 26 and 27, respectively. The initialization transistor T5a made of an N-type oxide transistor may perform a switching operation opposite to that of the P-type light emission control transistor T4a in response to the light emission control signal EM2[n].

The switching transistor T1a and the compensation transistor T2a, which are made of N-type oxide transistors, are turned on respectively by a gate high voltage of the scan signal SCAN2[n] and a gate high voltage of the scan signal SCAN1[n], and are turned off by a gate low voltage thereof. The scan drivers 210 and 220 may generate positive pulse type scan signals SCAN1[n] and SCAN2[n], respectively and supply the scan signals SCAN1[n] and SCAN2[n] to the gate lines 24 and 25, respectively.

To this end, each stage of the scan drivers 210 and 220 may further include an inverter that inverts a negative pulse type carry signal to output the positive pulse type scan signals SCAN1[n] and SCAN2[n].

The inverter according to one embodiment has a structure in which the P-type LTPS transistor and the N-type oxide transistor, which share a gate electrode and an output line, completely overlap each other in the thickness direction of the display panel 100, whereby a circuit configuration and a circuit area of the inverter may be reduced. A detailed description of the inverter will be given later with reference to FIGS. 4 to 7.

Figure 3:
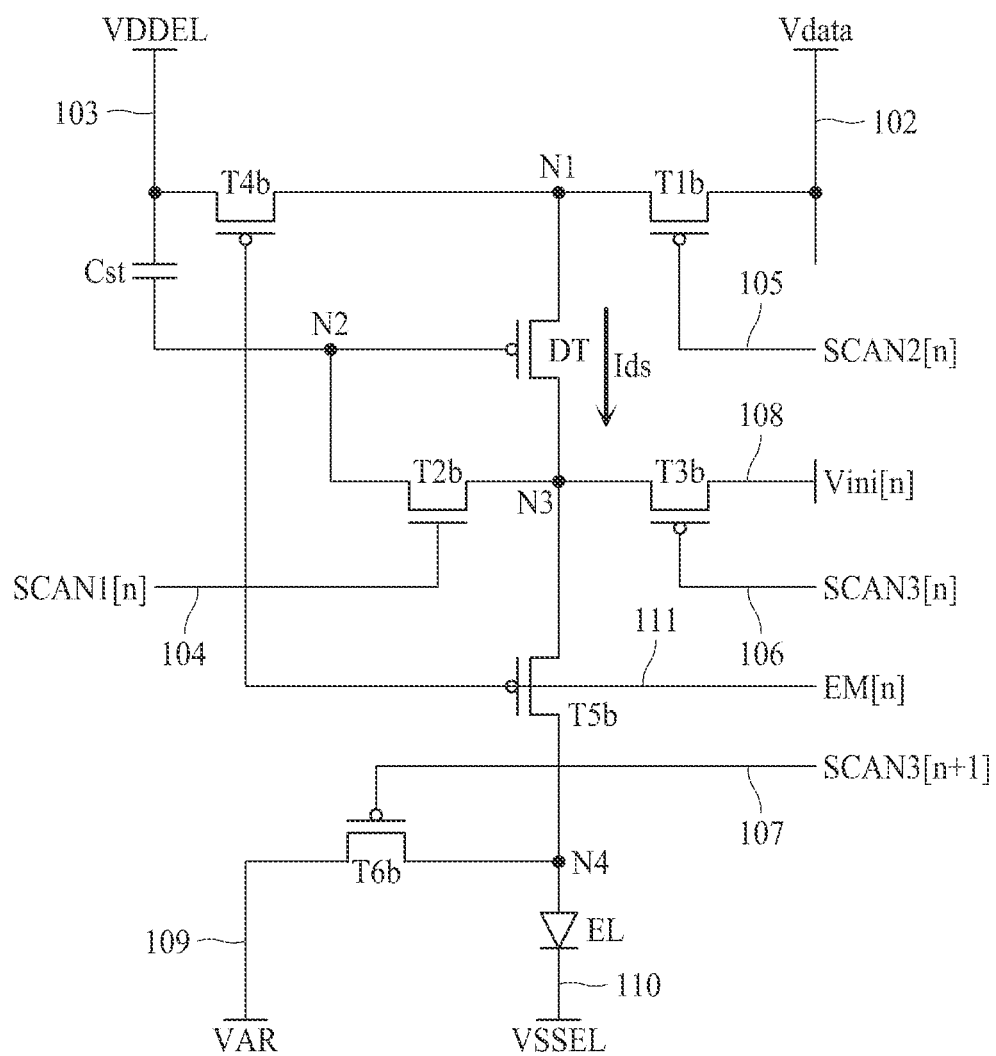
FIG. 3 is an equivalent circuit view illustrating a configuration of a pixel circuit of a subpixel according to one embodiment of the present disclosure.

FIG. 3 is an equivalent circuit view illustrating a configuration of a pixel circuit of a subpixel according to one embodiment.

Referring to FIG. 3, the pixel circuit 10B of each subpixel may have a 7T1C (seven transistors and one capacitor) structure that includes a light emitting element EL, a driving transistor DT, a switching transistor T1b, a compensation transistor T2b, an operation control transistor T4b, a light emission control transistor T5b, a first initialization transistor T3b, a second initialization transistor T6b and a storage capacitor Cst. The switching transistor T1b, the compensation transistor T2b, the operation control transistor T4b, the light emission control transistor T5b, the first initialization transistor T3b and the second initialization transistor T6b may be represented as first to sixth switching transistors T1b to T6b.

The plurality of transistors DT and T1b to T6b constituting the pixel circuit 10B of the subpixel according to one embodiment may include an LTPS transistor and an oxide transistor.

For example, the driving transistor DT and the switching transistor T1b, the operation control transistor T4b, the light emission control transistor T5b, the first initialization transistor T3b and the second initialization transistor T6b may be formed of P-type LTPS transistors having fast mobility, and the compensation transistor T2b may be formed of an N-type oxide transistor having a small leakage current. The compensation transistor T2b may prevent or at least reduce flicker from occurring by suppressing a leakage current during low speed driving in which a screen update speed is relatively slow.

The pixel circuit 10B according to one embodiment may be connected to first to fifth gate lines 104, 105, 106, 107 and 111, a data line 102, first and second power lines 103 and 110, a first initialization line 108 and a second initialization line 109, which are disposed in the display panel (100 of FIG. 1).

The light emitting element EL includes an anode connected to a second electrode of the driving transistor DT through the light emission control transistor T5b, a cathode connected to the second power line 110 for supplying a second power voltage VSSEL and an organic light emitting layer between the anode and the cathode. The light emitting element EL may generate light of luminance proportional to a current value of a driving current supplied from the driving transistor DT.

The compensation transistor T2b may be controlled by the first gate line 104, and may connect a second node N2 connected to the gate electrode of the driving transistor DT with a third node N3 connected to the second electrode of the driving transistor DT. The compensation transistor T2b may be turned on by a gate-on voltage of a first scan signal SCAN1[n] supplied through the first gate line 104 to connect the gate electrode with the second electrode of the driving transistor DT, thereby connecting the driving transistor DT in a diode structure. The first gate line 104 may share two pixel lines, that is, (n-1)th and (n)th pixel lines.

The switching transistor T1b may be controlled by the second gate line 105, and may connect the data line 102 with a first node N1 connected to a first electrode of the driving transistor DT. The switching transistor T1b may be turned on by a gate-on voltage of a second scan signal SCAN2[n] supplied through the second gate line 105 to supply a data voltage Vdata supplied through the data line 102 to the first electrode of the driving transistor DT.

The operation control transistor T4b may be controlled by the fifth gate line 111, and may connect a first power line 103 with the first node N1 connected to the first electrode of the driving transistor DT. The operation control transistor T4b may be turned on by the gate-on voltage of the light emission control signal EM[n] supplied through the fifth gate line 111 to supply the first power voltage EVDD supplied through the first power line 103 to the first electrode of the driving transistor DT.

The light emission control transistor T5b may be controlled by the fifth gate line 111, and may connect the third node N3 connected to the second electrode of the driving transistor DT with a fourth node N4 connected to the anode electrode of the light emitting element EL. The light emission control transistor T5b may be turned on by the gate-on voltage of the light emission control signal EM[n] supplied through the fifth gate line 111 to connect the second electrode of the driving transistor DT with the anode electrode of the light emitting element EL.

The first initialization transistor T3b may be controlled by the third gate line 106, and may connect the third node N3 connected to the second electrode of the driving transistor DT with a first initialization line 108. The first initialization transistor T3b may be turned on by a gate-on voltage of a third scan signal SCAN3[n] supplied through the third gate line 106 to supply an initialization signal Vini[n] supplied through the first initialization line 108 to the third node N3 connected to the second electrode of the driving transistor DT.

The second initialization transistor T6*b* may be controlled by the fourth gate line 107, and may connect the second initialization line 109 with the fourth node N4 connected to the anode of the light emitting element EL. The second initialization transistor T6*b* may be turned on by a gate-on voltage of a fourth scan signal SCAN3[n+1] supplied through the fourth gate line 107 to supply an initialization voltage VAR (anode reset voltage) supplied through the second initialization line 109 to the fourth node N4 connected to the anode electrode of the light emitting element EL. The fourth gate line 107 may share a third gate line for supplying a fourth scan signal SCAN3[n+1] in an (n+1)th pixel line.

The storage capacitor Cst may be connected between the first power line 103 and the second node N2 connected to the gate electrode of the driving transistor DT. The storage capacitor Cst may be charged to a target voltage with a differential voltage between the first power voltage VDDEL supplied through the first power line 103 and the data voltage Vdata in which a threshold voltage Vth of the driving transistor DT is compensated, which is supplied to the second node N1, and may provide the charged target voltage as a driving voltage of the driving transistor DT.

The driving transistor DT may control light emission intensity of the light emitting element EL by controlling a current Ids flowing to the light emitting element EL in accordance with the driving voltage charged in the storage capacitor Cst.

Referring to FIGS. 1 and 3, the first scan driver 210 may supply the first scan signal SCAN1[*n*] to the first gate line 104, and the second scan driver 220 may supply the second scan signal SCAN2[*n*] to the second gate line 105. The gate driver 200 may further include a third scan driver for supplying third and fourth scan signals SCAN3[*n*] and SCAN3[*n*+1] to the third and fourth gate lines 106 and 107. The third scan driver may use the output of the second scan driver 220. The light emission control driver 230 may supply the light emission control signal EM[n] to the fifth gate line 111. The gate driver 200 may further include an initialization signal generator for generating a first initialization signal Vini[n] using the output of the light emission control driver 230 and supplying the first initialization signal Vini[n] to the first initialization line 108. The data driver 400 may supply the data voltage Vdata to the data line 102. A power management circuit may supply a first high potential power voltage VDDEL to the first power line 103, may supply a low potential power voltage VSSEL to the second power line 110, and may supply the initialization voltage VAR to the second initialization line 109.

The operation control transistor T4*b* and the light emission control transistor T5*b*, which are made of P-type LTPS transistors, are turned on by the gate low voltage of the light emission control signal EM[n], and are turned off by the gate high voltage thereof. The light emission control driver 230 may generate a negative pulse type light emission control signal EM[n] and supply the generated light emission control signal EM[n] to the gate line 111.

The switching transistor T1*b*, the first initialization transistor T3*b* and the second initialization transistor T6*b*, which are comprised P-type LTPS transistors, are turned on respectively by the gate low voltage of the scan signal SCAN2[n], the gate low voltage of the scan signal SCAN3[n] and the gate low voltage of the scan signal SCAN3[n+1], and are turned off by the gate high voltage thereof. The second scan driver 220 may generate a negative pulse type scan signal SCAN2[n] and supply the scan signal SCAN2[n] to the gate line 105. The third gate driver may generate negative pulse type scan signals SCAN3[n] and SCAN3[n+1] and supply the scan signals SCAN3[n] and SCAN3[n+1] to the gate lines 106 and 107, respectively.

The compensation transistor T2*b*, which is made of an N-type oxide transistor, is turned on by the gate high voltage of the scan signal SCAN1[n], and is turned off by the gate low voltage thereof. The first scan driver 210 may generate a positive pulse type scan signal SCAN1[n] and supply the scan signal SCAN1[n] to the gate line 104.

To this end, each stage of the first scan driver 210 may further include an inverter that inverts a negative pulse type carry signal to output the positive pulse type scan signal SCAN1[*n*].

The inverter according to one embodiment has a structure in which the P-type LTPS transistor and the N-type oxide transistor, which share a gate electrode and an output line, completely overlap each other in the thickness direction of the display panel (100 of FIG. 1), whereby a circuit configuration and a circuit area of the inverter may be reduced. A detailed description of the inverter will be given later with reference to FIGS. 4 to 7.

Figure 4:
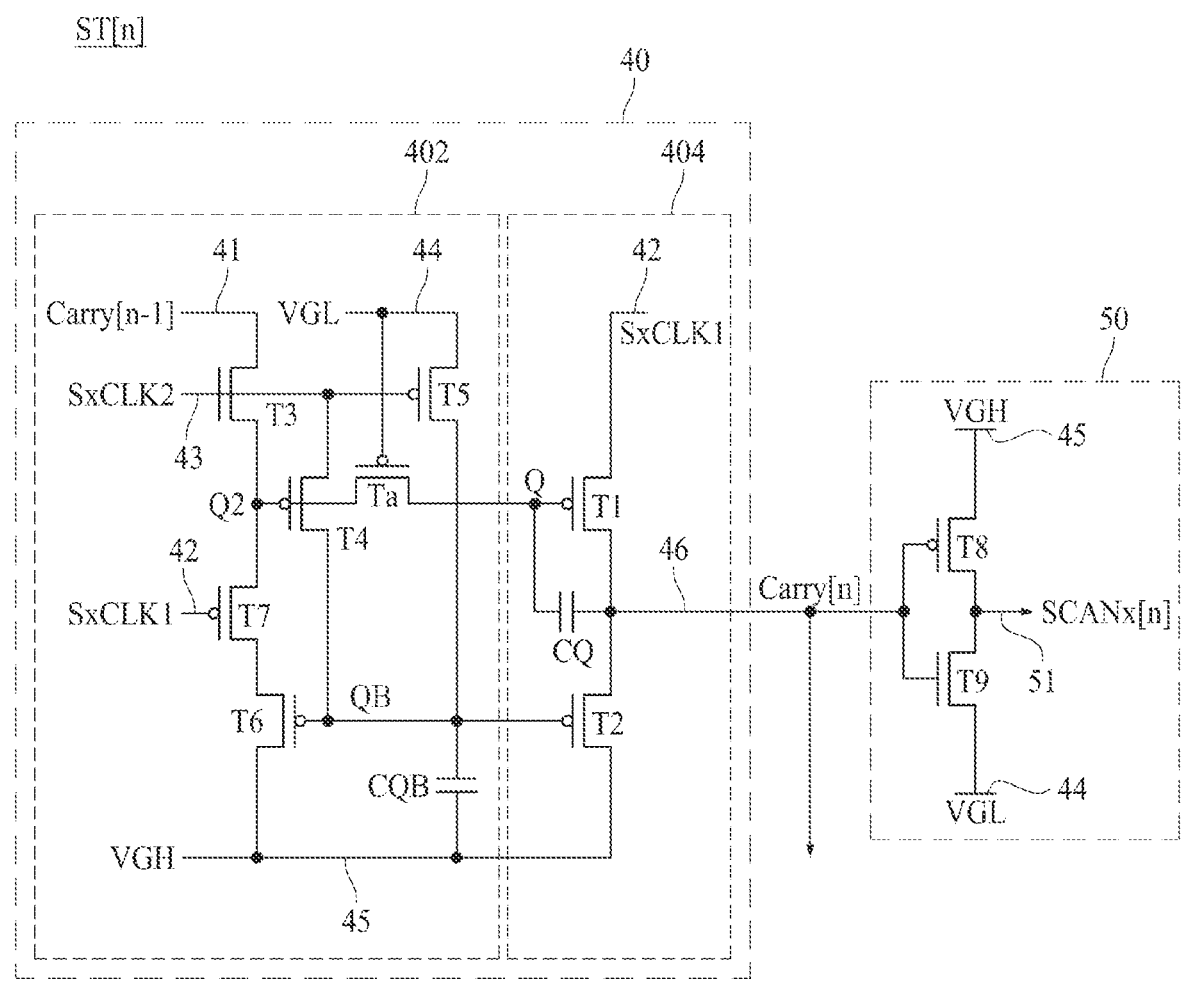
FIG. 4 is an equivalent circuit view illustrating a configuration of a stage of a scan driver according to one embodiment of the present disclosure.
Figure 5:
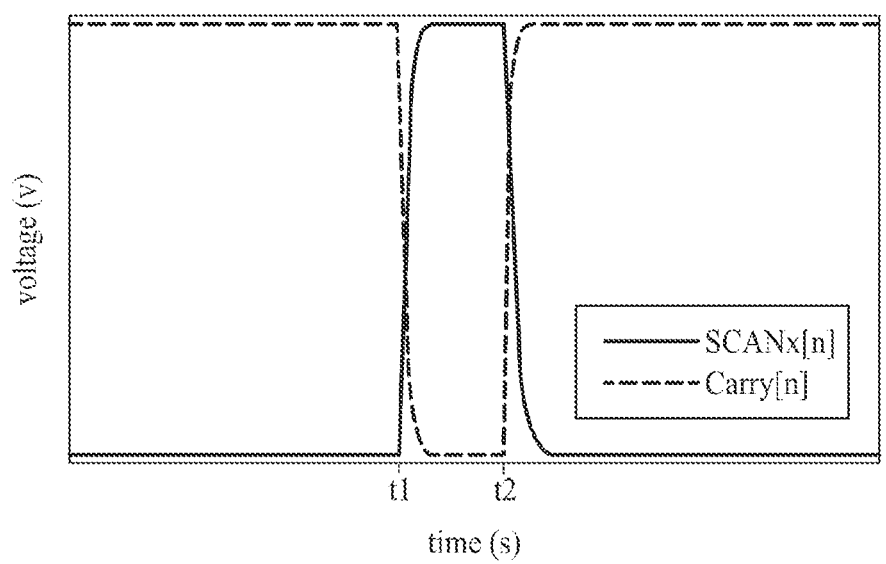
FIG. 5 is an input and output waveform illustrating an inverter according to one embodiment of the present disclosure.

FIG. 4 is an equivalent circuit view illustrating a configuration of a stage of a scan driver according to one embodiment, and FIG. 5 is an input and output waveform illustrating an inverter according to one embodiment.

Referring to FIGS. 4 and 5, the scan stage ST[n] of the scan driver according to one embodiment may include a basic stage 40 for shifting a carry signal Carry[n−1] from a previous scan stage to generate a carry signal Carry[n] and an inverter 50 for inverting the carry signal Carry[n] to generate a scan signal SCANx[n], x=1, 2 and 3.

The scan stage ST[n] according to one embodiment may be connected to a first input line 41 to which a carry signal Carry[n−1] from a previous scan stage is supplied, first and second clock lines 42 and 43 to which first and second clock signals SxCLK1 and SxCLJK2 are respectively supplied, a first power line 44 to which a gate low voltage VGL is supplied, a second power line 45 to which a gate high voltage VGH is supplied, a carry output line 46 for outputting a carry signal Carry[n], and a gate line 51 for outputting a scan signal SCANx[n]. When the scan stage ST[n] is a first stage, a start signal may be supplied to the first input line 41. The carry signal Carry[n−1] and the start signal may be expressed as input signals.

The first and second clock signals SxCLK1 and SxCLK2 may be two clock signals of a plurality of clock signals having different phases. Each of the first and second clock signals SxCLK1 and SxCLK2 may be supplied in the form of a pulse for swinging the gate low voltage VGL and the gate high voltage VGH.

The basic stage 40 in the scan stage ST[n] according to one embodiment may include a node controller 402 and an output buffer 404. The output buffer 404 may include first and second transistors T1 and T2, and the node controller 402 may include third to seventh transistors T3 to T7 and a resistance transistor Ta. The inverter 50 in each scan stage ST[n] may include eighth and ninth transistors T8 and T9.

The plurality of transistors T1 to T9 and Ta constituting the scan stage ST[n] according to one embodiment may include an LTPS transistor and an oxide transistor.

For example, the first, second and fourth to eighth transistors T1, T2 and T4 to T8 and the resistance transistor Ta may be made of P-type LTPS transistors, and the third and ninth transistors T3 and T9 may be made of N-type oxide transistors.

In the output buffer 404, the P-type first transistor T1 may output the first clock signal SxCLK1 supplied through the first clock line 42 to the carry output line 46 in response to control of a first control node Q. While the first control node Q is being activated, the first transistor T1 may be turned on to output the first clock signal SxCLK1 as the carry signal Carry[n].

The output buffer 404 may further include a first capacitor CQ connected between the first control node Q and the carry output line 46.

In the output buffer 404, the P-type second transistor T2 may output the gate high voltage VGH supplied to the second power line 45 to the carry output line 46 in response to control of a second control node QB. While the second control node QB is being activated, the second transistor T2 may be turned on to output the gate high voltage VGH as the gate high voltage of the carry signal Carry[n].

The output buffer 404 may output a negative pulse type carry signal Carry[n] as shown in FIG. 5.

The N-type third transistor T3 in the node controller 402 may supply the previous carry signal Carry[n−1] supplied through the first input line 41 to a third control node Q2 in response to control of the second clock signal SxCLK2 supplied through the second clock line 43. The third transistor T3 may be turned on by the gate high voltage of the second clock signal SxCLK2 to supply the previous carry signal Carry[n−1] to the third control node Q2.

The P-type fourth transistor T4 in the node controller 402 may supply the gate high voltage of the second clock signal SxCLK2 to the second control node QB in response to control of the third control node Q2. While the third control node Q2 is being activated by the gate low voltage of the previous carry signal Carry[n], the fourth transistor T4 may be turned on to supply the gate high voltage to the second control node QB, thereby deactivating the second control node QB.

The P-type fifth transistor T5 in the node controller 402 may supply the gate low voltage VGL supplied through the first power line 44 to the second control node QB in response to the control of the second clock signal SxCLK2. The fifth transistor T5 may be turned on by the gate low voltage of the second clock signal SxCLK2 to supply the gate low voltage VGL to the second control node QB, thereby activating the second control node QB.

The P-type sixth transistor T6 in the node controller 402 may connect the seventh transistor T7 to the second power line 45 in response to the control of the second control node QB, and the P-type seventh transistor T7 may connect the third control node Q2 to the second power line 45 through the sixth transistor T6 in response to the control of the first clock signal SxCLK1. While the second control node QB and the first clock signal SxCLK1 are being activated by the gate low voltage VGL, the sixth transistor T6 and the seventh transistor T7 may be turned on to supply the gate high voltage VGH to the third control node Q2, thereby deactivating the third control node Q2.

The P-type resistance transistor Ta in the node controller 402 may be turned on by the gate low voltage VGL to serve as a resistor for connecting the third control node Q2 with the first control node Q.

The node controller 402 may further include a second capacitor CQB connected between the second control node QB and the second power line 45.

The P-type eighth transistor T8 in the inverter 50 may output the gate high voltage VGH to the gate line 51 in response to the control of the carry signal Carry[n]. The eighth transistor T8 may be turned on for periods t1 and t2, at which the carry signal Carry[n] is the gate low voltage, to output the gate high voltage VGH as a gate high voltage of the scan signal SCANx[n].

The N-type ninth transistor T9 in the inverter 50 may output the gate low voltage VGL to the gate line 51 in response to the control of the carry signal Carry[n]. The ninth transistor T9 may be turned on for a period, at which the carry signal Carry[n] is the gate high voltage, to output the gate low voltage VGL as a gate low voltage of the scan signal SCANx[n].

As shown in FIG. 5, the inverter 50 may output a positive pulse type scan signal SCANx[n].

In the inverter 50 according to one embodiment, the P-type LTPS transistor T8 and the N-type oxide transistor T9 are disposed to completely overlap each other in the thickness direction of the display panel 100, so that a circuit configuration and a circuit area of the inverter 50 may be reduced.

Figure 6:
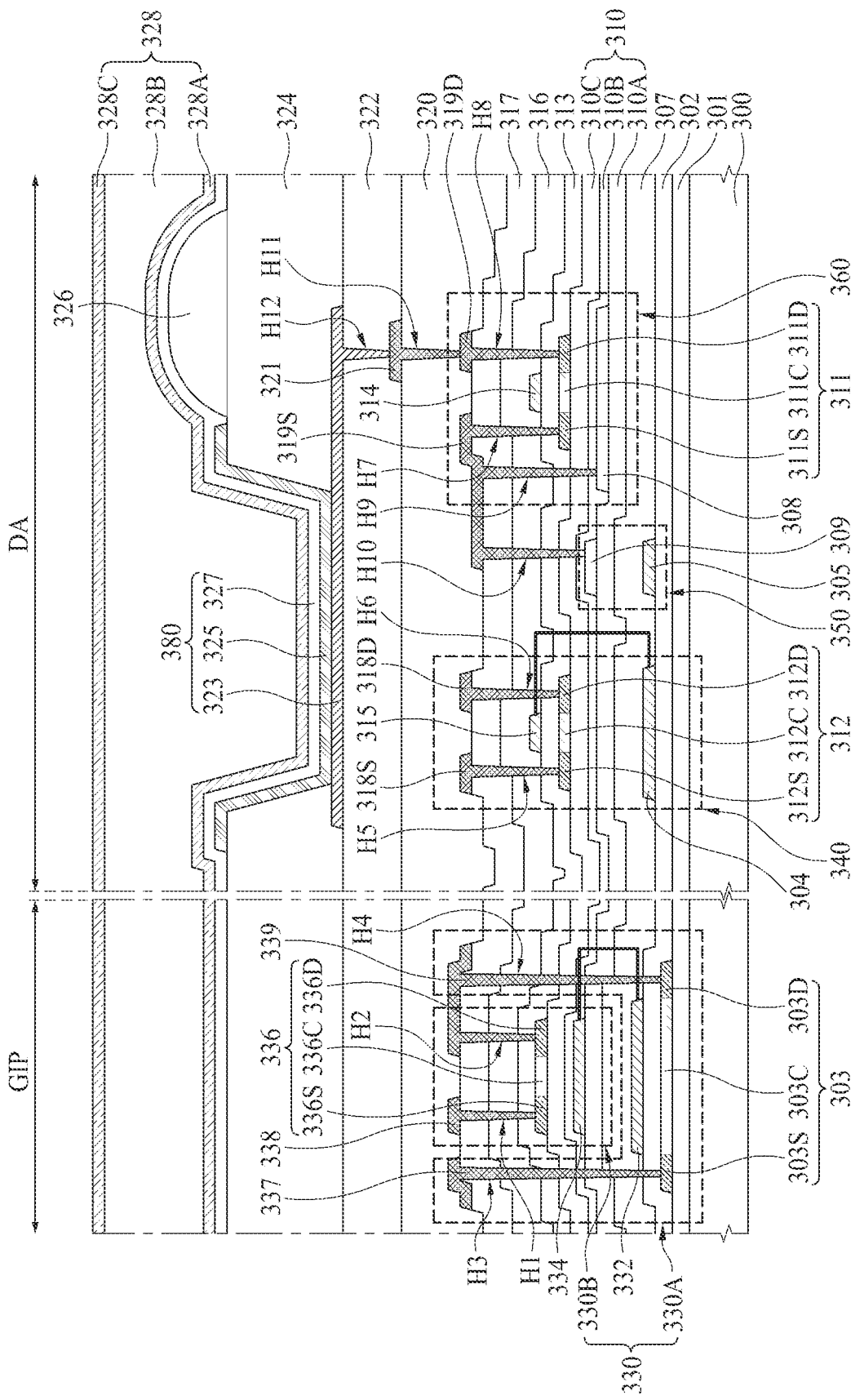
FIG. 6 is a cross-sectional view illustrating a partial configuration of a display panel that includes an inverter according to one embodiment of the present disclosure.

FIG. 6 is a cross-sectional view illustrating a partial configuration of a display panel that includes an inverter according to one embodiment.

FIG. 6 illustrates a cross-sectional structure of a subpixel in which the display area DA includes a light emitting element 380 of a pixel circuit, a driving transistor 360, a switching transistor 340 and a storage capacitor 350. The driving transistor 360 and the switching transistor 340 of the pixel circuit may have an N-type oxide transistor structure.

FIG. 6 illustrates a cross-sectional structure of an inverter 330 in which a gate driver area GIP includes a P-type LTPS transistor 330A and an N-type oxide transistor 330B. The P-type LTPS transistor 330A may represent P-type LTPS transistors included in the gate driver area GIP, and the N-type oxide transistor 330B may represent N-type oxide transistors included in the gate driver area GIP. The P-type LTPS transistor 330A and the N-type oxide transistor 330B may respectively correspond to the P-type eighth transistor T8 and the N-type ninth transistor T9, which are shown in FIG. 4.

Referring to FIG. 6, a circuit element layer including the inverter 330 of the gate driver area GIP and the driving transistor 360, the switching transistor 340 and the storage capacitor 350 of the display area DA may be disposed on a substrate 300, a light emitting element layer including a light emitting element 380 may be disposed on the circuit element layer, and an encapsulation layer 328 may be disposed on the light emitting element layer. A touch sensor array including a plurality of touch electrodes may be further disposed on the encapsulation layer 328. A color filter array including a color filter and a black matrix may be further disposed on the touch sensor array.

The substrate 300 may include a plastic substrate or a glass substrate. The plastic substrate may be formed of a flexible material. For example, the substrate 300 may include an organic insulating material of at least one of an acrylic resin, an epoxy-based resin, a siloxane-based resin, a polyimide-based resin or a polyamide-based resin.

A lower buffer layer 301 may be disposed on the substrate 300. The lower buffer layer 301 may prevent or at least reduce impurities such as hydrogen from flowing into a semiconductor layer 303 through the substrate 300. The lower buffer layer 301 may include an inorganic insulating material. For example, the lower buffer layer 301 may include an oxide-based insulating material such as silicon oxide (SiOx) or aluminum oxide ($AL_2O_3$).

In the embodiment, a barrier layer capable of blocking inflow of particles may be further disposed between the substrate 300 and the lower buffer layer 301. The barrier layer may include a multi-barrier layer in which at least one organic insulating layer and at least one inorganic insulating layer are alternately stacked.

The P-type LTPS transistor 330A of the inverter 330 may include a semiconductor layer 303 disposed on the lower buffer layer 301, a gate electrode 332 overlapping a channel area 303C of the semiconductor layer 303 with a first gate insulating layer 302 interposed therebetween, and first and second electrodes 337 and 339 respectively connected to conductorization areas 303S and 303D of the semiconductor layer 303 through contact holes H3 and H4. The semiconductor layer 303 is made of low-temperature polysilicon (LPTS), and the conductorization areas 303S and 303D may be areas doped with P-type impurities.

The N-type oxide transistor 330B of the inverter 330 may include a gate electrode 334 overlapping the gate electrode 332 of the LTPS transistor 330A with a plurality of insulating layers interposed therebetween, a semiconductor layer 336 overlapping the gate electrode 334 with at least one insulating layer interposed therebetween, and first and second electrodes 338 and 339 respectively connected to conductorization areas 336S and 336D of the semiconductor layer 336 through contact holes H1 and H2. The semiconductor layer 336 of the oxide transistor 330B may be made of an oxide semiconductor layer that includes at least one of IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based or ITZO(InSnZnO)-based semiconductor layer. The conductorization areas 336S and 336D of the semiconductor layer 336 may be an area doped with N-type impurities.

A first interlayer insulating layer 307 and a first sub-buffer layer 310A of an upper buffer layer 310 disposed on the first interlayer insulating layer 307 may be disposed between the gate electrode 332 of the LTPS transistor 330A and the gate electrode 334 of the oxide transistor 330B. The first interlayer insulating layer 307 covering the gate electrode 332 of the LTPS transistor 330A may be comprised of one inorganic insulating layer or a double-layered structure of first and second inorganic insulating layers formed of different materials. For example, the first interlayer insulating layer 307 may have a double-layered structure in which a first inorganic insulating layer including silicon oxide (SiOx) directed and a second inorganic insulating layer including silicon nitride (SiNx) are stacked.

A double insulating layer comprised of second and third sub buffer layers 310B and 310C of the upper buffer layer 310 may be disposed between the gate electrode 334 of the oxide transistor 330B and the semiconductor layer 336.

The upper buffer layer 310 may have a triple-layered structure in which first to third sub-buffer layers 310A, 310B and 310C are stacked. The first sub-buffer layer 310A and the third sub-buffer layer 310C may be made of silicon oxide (SiO$_2$) that does not include hydrogen particles. The second sub-buffer layer 310B between the first sub-buffer layer 310A and the third sub-buffer layer 310C may be made of silicon nitride (SiNx) having excellent collection capability with respect to hydrogen particles. The second sub-buffer layer 310B and the third sub-buffer layer 310C may have a structure covering the gate electrode 334 of the oxide transistor 330B.

The gate electrode 334 of the oxide transistor 330B may have a larger area than the semiconductor layer 336 so as to completely overlap the semiconductor layer 336.

A second gate insulating layer 313 and second and third interlayer insulating layers 316 and 317 may be disposed on the semiconductor layer 336 of the oxide transistor 330B.

The second gate insulating layer 313 covering the semiconductor layer 336 and the second and third interlayer insulating layers 316 and 317 may include an inorganic insulating material. One of the second and third interlayer insulating layers 316 and 317 may be omitted.

The first electrode 337 and the second electrode 339 of the LTPS transistor 330A and the first electrode 338 and the second electrode 339 of the oxide transistor 330B may be disposed on the third interlayer insulating layer 317.

The first electrode 337 of the LTPS transistor 330A may be connected to the second power line (45 of FIG. 4) to receive the gate high voltage VGH. The gate electrode 337 may be also connected to the first power line (44 of FIG. 4) of the first electrode 338 of the oxide transistor 330B to receive the gate low voltage VGL.

The gate electrode 332 of the LTPS transistor 330A and the gate electrode 334 of the oxide transistor 330B may be connected to each other through a contact hole to constitute a common gate electrode for receiving the carry signal.

The second electrode 339 of the LTPS transistor 330A and the second electrode 339 of the oxide transistor 330B are connected to the gate line 51 for outputting the scan signal (SCANx[n] of FIG. 4), and thus may constitute a common output line. The second electrode 339 of the LTPS transistor 330A and the second electrode 339 of the oxide transistor 330B may be integrally formed to constitute the common output line for outputting the scan signal.

The LTPS transistor 330A and the oxide transistor 330B, which constitute the inverter 330, completely overlap each other in the thickness direction (vertical direction) of the display panel, whereby a circuit area of the inverter 330 may be reduced.

In the embodiment, a channel width of the channel area 336C of the semiconductor layer 336 in the oxide transistor 330B may be set to be greater than that of the channel area 303C of the semiconductor layer 303 in the LTPS transistor 330A. For example, a channel width of the oxide semiconductor layer may be greater than that of the polysilicon semiconductor layer.

The switching transistor 340 of the display area DA may include a first light shielding layer 304 disposed on the first gate insulating layer 302, a semiconductor layer 312 disposed on the upper buffer layer 310, a gate electrode 315 overlapping a channel area 312C of the semiconductor layer 312 with the second gate insulating layer 313 interposed therebetween, and first and second electrodes 318S and 318D disposed on the third interlayer insulating layer 317 and respectively connected to the conductorization areas 312S and 312D of the semiconductor layer 312 through contact holes H5 and H6. The semiconductor layer 312 of the switching transistor 340 may be an oxide semiconductor layer, and the conductorization areas 312S and 312D may be areas doped with N-type impurities. The first light shielding layer 304 of the switching transistor 340 and the gate electrode 315 are connected through a contact hole so that the switching transistor 340 may have a dual gate structure. The first light shielding layer 304 may have a larger area than the semiconductor layer 312 so as to completely overlap the semiconductor layer 312.

The driving transistor 360 of the display area DA includes a second light shielding layer 308 disposed on the first sub buffer layer 310A of the upper buffer layer 310, a semiconductor layer 311 disposed on the upper buffer layer 310, a gate electrode 314 overlapping the channel area 311C of the semiconductor layer 311 with the second gate insulating layer 313 interposed therebetween and a first electrode 319S and a second electrode 319D disposed on the third interlayer insulating layer 317 and connected to the conductorization areas 311S and 311D of the semiconductor layer 311 through contact holes H7 and H8. The semiconductor layer 311 of the driving transistor 360 is an oxide semiconductor layer and the conductorization areas 311S and 311D may be areas doped with N-type impurities. The second light shielding layer 308 may have an arear larger than that of the semiconductor layer 311 so as to completely overlap the semiconductor layer 311. The semiconductor layer 312 of the switching transistor 340 and the semiconductor layer 311 of the driving transistor 360 include an oxide semiconductor layer disposed on the same layer as the oxide semiconductor layer 336 of the second transistor 330B.

The second light shielding layer 308 of the driving transistor 360 may be connected to the first electrode 319S through the contact hole H7.

The storage capacitor 350 of the display area DA may include a lower storage electrode 305 disposed on the first gate insulating layer 302 and an upper storage electrode 309 disposed on the first sub-buffer layer 310A of the upper buffer layer 310 and overlapping the lower storage electrode 305. The upper storage electrode 309 may be connected to the first electrode 319S of the driving transistor 360 through a contact hole H10.

The gate electrode 332 of the LTPS transistor 330A of the inverter 330, the first light shielding layer 304 of the switching transistor 340 and the lower storage electrode 305 are disposed on the same first gate insulating layer 302 and are made of a first metal layer of the same metal material, and thus may be formed by the same mask process.

The gate electrode 334 of the oxide transistor 330B of the inverter 330, the second light shielding layer 308 of the driving transistor 360 and the upper storage electrode 309 are disposed on the same first sub buffer layer 310A and are made of a second metal layer of the same metal material, and thus may be formed by the same mask process.

The gate electrode 315 of the switching transistor 340 and the gate electrode 314 of the driving transistor 360 are disposed on the same second gate insulating layer 313 and are made of a third metal layer of the same metal material, and thus may be formed by the same mask process.

The first electrode 337 and the second electrode 339 of the LTPS transistor 330A, the first electrode 338 and the second electrode 339 of the oxide transistor 330B, the first electrode 318S and the second electrode 318D of the switching transistor 340 and the first electrode 319S and the second electrode 319D of the driving transistor 360 are disposed on the same third interlayer insulating layer 317 and are made of a fourth metal layer of the same metal material, and thus may be formed by the same mask process.

Each of the first to fourth metal layers described above may have a single layer or multi-layered structure that includes at least one of any one of molybdenum (Mo), aluminum (Al), chromium (Cr), gold (Au), titanium (Ti), nickel (Ni), neodymium (Nd) and copper (Cu), or their alloy.

First and second planarization layers 320 and 322 may be disposed on the inverter 330, the switching transistor 340 and the driving transistor 360 in a stacked structure. The first and second planarization layers 320 and 322 may include an organic insulating material such as polyimide or acrylic resin.

A connection electrode 321 disposed on the first planarization layer 320 may be connected to the second electrode 319D of the driving transistor 360 through a contact hole H11.

A light emitting element layer including a light emitting element 380, a bank 324 and a spacer 326 may be disposed on the second planarization layer 322.

The light emitting element 380 includes a first electrode 323, a light emitting stack 325 and a second electrode 327, which are disposed on the second planarization layer 322. One of the first electrode 323 and the second electrode 327 may be an anode electrode, and the other may be a cathode electrode. The first electrode 323 may be connected to the connection electrode 321 through a contact hole H12 and thus connected to the second electrode 319D of the driving transistor 360.

The first electrode 323 of the light emitting element 380 may be separated for each subpixel P and then independently disposed. The first electrode 323 of the light emitting element 380 may have a structure of a plurality of conductive layers having high reflectance. For example, the first electrode 323 may be formed of a stacked structure (Ti/Al/Ti) of aluminum (Al) and titanium (Ti), a stack structure (ITO/Al/ITO) of aluminum (Al) and indium tin oxide (ITO) or a stack structure (ITO/APC/ITO) of APC and ITO. The APC is an alloy of silver (Ag), palladium (Pd) and copper (Cu).

The bank 324 having an opening for exposing the first electrode 323 and covering an end of the first electrode 323 may be disposed on the second planarization layer 322 on which the first electrode 323 is disposed. The opening of the bank 324 may be defined as a light emission area, and the area in which the bank 324 is disposed may be defined as a non-light emission area. The bank 324 surrounding the light emission area may be formed in a single layered structure or a double layered structure. A spacer 326 having an opening wider than the opening of the bank 324 may be further disposed on the bank 324. The spacer 326 may support a deposition mask when the light emitting layer of the light emitting stack 325 is formed. The bank 324 and the spacer 326 may be formed of an organic insulating material. The bank 324 may include a light shielding material to shield light leakage between adjacent pixels and reduce reflection of external light.

The light emitting stack 325 may be formed by stacking a hole control layer, a light emitting and an electron control layer in due order or reverse order. The hole control layer and the electron control layer are common layers commonly formed in the plurality of subpixels P, and the light emitting layer may be independently formed in the light emission area of each subpixel. The hole control layer may include at least a hole transport layer of a hole injection layer and the hole transport layer, and the electron control layer may include at least an electron transport layer of the electron transport layer and an electron injection layer. The light emitting layer may generate any one of red light, green light and blue light, and may be formed in a light emission area of a corresponding subpixel P through an opening of a fine metal mask (FMM) that is a deposition mask. The light emitting stack 325 overlapping the first electrode 323 may partially overlap an end of the bank 324.

The second electrode 327 of the light emitting element 380 may be disposed on the light emitting stack 325, and may be a common electrode connected along surfaces of the bank 324 and the spacer 326. The second electrode 327 may be formed of a conductive material having high light transmittance or a semi-transmissive conductive material. For example, the second electrode 327 may be formed of a transparent conductive material such as ITO or IZO. The second electrode 327 may be formed of a semi-transmissive metal material such as magnesium (Mg), silver (Ag) or their alloy. A capping layer may be further disposed on the second electrode 327 to increase optical resonance and light emission efficiency of the light emitting element 380. The second electrode 327 may be disposed in the entire area of the display area DA and extended to a bezel area including a gate driver area GIP so that the second electrode 327 may be connected to a power supply line disposed on another layer in the bezel area.

The encapsulation layer 328 for sealing the light emitting element layer is disposed on the light emitting element layer including the light emitting element 380, the bank 324 and the spacer 326, so that moisture or oxygen may be prevented or at least reduced from being permeated into the light emitting element 380 and particles may be covered to prevent or at east reduce flow of the particles. The encapsulation layer 328 may have a stacked structure in which k number of inorganic encapsulation layers 328A and 328C (k is an integer equal to or greater than 2) and (k−1) number of organic encapsulation layers 328B are alternately disposed. The inorganic encapsulation layers 328A and 328C may prevent or at least reduce moisture or oxygen from being permeated from the outside. The organic encapsulation layer 328B may serve to cover the particles and buffer stress between the respective layers when the display panel is bent.

As described above, in the display panel according to one embodiment, the P-type LTPS transistor 330A and the N-type oxide transistor 330B, which constitute the inverter 330, may be disposed to completely overlap each other in the thickness direction of the display panel, thereby reducing the circuit area of the inverter 330.

Figure 7:
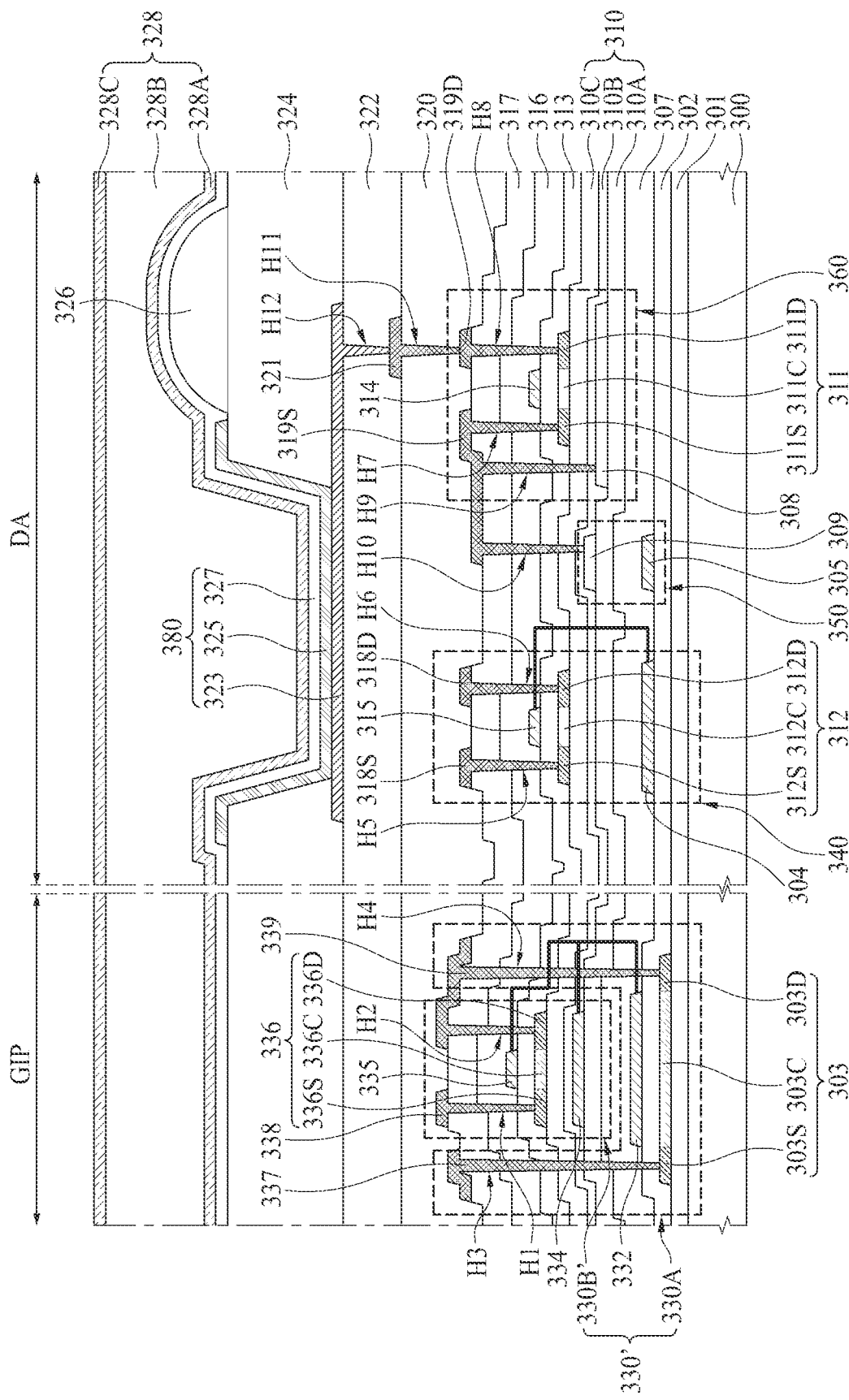
FIG. 7 is a cross-sectional view illustrating a partial configuration of a display panel that includes an inverter according to one embodiment of the present disclosure.

FIG. 7 is a cross-sectional view illustrating a partial configuration of a display panel that includes an inverter according to one embodiment.

The embodiment shown in FIG. 7 is different from the embodiment shown in FIG. 6 in that an N-type oxide transistor 330B' is additionally provided with an upper gate electrode 335 in an inverter 330' disposed in a gate driver area GIP. Since the other elements of the embodiment shown in FIG. 7 are the same as those of the embodiment shown in FIG. 6, their repeated description will be omitted.

Referring to FIG. 7, the inverter 330' disposed in the gate driver area GIP includes a P-type LTPS transistor 330A and an N-type oxide transistor 330B', which are disposed to completely overlap each other in a thickness direction of a display panel.

The N-type oxide transistor 330B' may include a lower gate electrode 334 disposed below the semiconductor layer 336 and an upper gate electrode 335 disposed above the semiconductor layer 336. The N-type oxide transistor 330B' may have a dual gate structure in which upper and lower gate electrodes 335 and 334 are connected to each other through a contact hole.

Upper and lower gate electrodes 335 and 334 of the oxide transistor 330B' may be connected to the gate electrode 332 of the LTPS transistor 330A through a contact hole to constitute a common gate electrode for receiving the carry signal.

The upper gate electrode 335 is disposed on the second gate insulating layer 313, similarly to the gate electrode 315 of the switching transistor 340 and the gate electrode 314 of the driving transistor 360, to overlap the semiconductor layer 336, and is made of the same metal material as that of the gate electrodes 315 and 314, and thus may be patterned by the same mask process.

As described above, in the display panel according to one embodiment, the P-type LTPS transistor 330A and the N-type oxide transistor 330B', which constitute the inverter 330', may be disposed to completely overlap each other in the thickness direction of the display panel, whereby the circuit area of the inverter 330 may be reduced.

In the inverters 330 and 330A according to one embodiment, the gate electrodes 334 and 335 of the N-type oxide transistor 330B' are disposed on the same layer as the second light shielding layer 308 and the gate electrode 314 of the driving transistor 360 of the display area DA and are made of the same metal layer as that of them, and thus may be implemented without an additional mask process.

In the inverters 330 and 330A according to one embodiment, the gate electrode 332 of the P-type LTPS transistor 330A may be connected to the gate electrodes 334 and 335 of the N-type oxide transistor 330B' to constitute a common gate electrode for receiving the carry signal, and the second electrodes 339 of the LTPS transistor 330A and the oxide transistor 330B' may constitute a common output line for outputting the scan signal.

As described above, the P-type LTPS transistor and the N-type oxide transistor, which constitute the inverter in the gate driver according to some embodiments, may be disposed to completely overlap each other in the thickness direction of the display panel (bezel area) to reduce the circuit area of the inverter, whereby the circuit area of the gate driver may be reduced.

Therefore, the gate driver and the display panel according to some embodiments may reduce the bezel area by reducing the circuit area of the gate driver that includes the inverter.

A display panel according to some embodiments may comprise: a display area in which a plurality of subpixels are disposed, a bezel area surrounding the display area, and a scan driver disposed in the bezel area, supplying a scan signal to at least one gate line connected to each of the plurality of subpixels, wherein the scan driver includes an inverter that inverts a carry signal generated from an input signal to output the scan signal. The inverter according to some embodiments includes a first transistor including a polysilicon semiconductor layer; and a second transistor including an oxide semiconductor layer, disposed to overlap the first transistor in a thickness direction of the display panel, and a gate electrode of the first transistor and a gate electrode of the second transistor, which overlap each other in the thickness direction, are connected to each other to constitute a common gate electrode that receives the carry signal.

According to some embodiments, the first transistor may include a first electrode and a second electrode, which are connected to the polysilicon semiconductor layer, the second transistor may include a first electrode and a second electrode, which are connected to the oxide semiconductor layer, and the second electrode of the first transistor and the second electrode of the second transistor may be connected to each other to constitute a common output line for outputting the scan signal.

According to some embodiments, the polysilicon semiconductor layer may be disposed on a lower buffer layer on a substrate, the gate electrode of the first transistor may be disposed to overlap the polysilicon semiconductor layer with a first gate insulating layer interposed therebetween, the first electrode and the second electrode of the first transistor may be disposed on a third interlayer insulating layer and are connected to the polysilicon semiconductor layer through first and second contact holes.

According to some embodiments, a gate electrode of the second transistor may be disposed to overlap the gate electrode of the first transistor with a first interlayer insulating layer covering the gate electrode of the first transistor and a first sub-buffer layer of an upper buffer layer disposed on the first interlayer insulating layer.

According to some embodiments, the oxide semiconductor layer may be disposed to overlap the gate electrode of the second transistor with second and third sub-buffer layers of the upper buffer layer interposed therebetween, the first electrode and the second electrode of the second transistor may be disposed on a third interlayer insulating layer and be connected to the oxide semiconductor layer through third and fourth contact holes.

According to some embodiments, the inverter further may include: a second gate insulating layer covering the oxide semiconductor layer; and a second interlayer insulating layer disposed between the second gate insulating layer and the third interlayer insulating layer.

According to some embodiments, the second transistor may further include an upper gate electrode disposed on the second gate insulating layer to overlap the oxide semiconductor layer and connected to the gate electrode of the second transistor.

According to some embodiments, a channel width of the oxide semiconductor layer may be greater than that of the polysilicon semiconductor layer.

According to some embodiments, the first transistor may be a P-type transistor, and the second transistor may be an N-type transistor.

According to some embodiments, the first electrode of the first transistor may be connected to a second power line to which a gate high voltage is supplied, and the first electrode of the second transistor may be connected to a first power line to which a gate low voltage is supplied.

According to some embodiments, each of the plurality of subpixels may include a switching transistor, and the switching transistor may include: a first light shielding layer disposed on the first gate insulating layer, a first semiconductor layer disposed on the upper buffer layer and overlapping the first light shielding layer, a first gate electrode disposed on the second gate insulating layer and overlapping the first semiconductor layer, and first and second electrodes disposed on the third interlayer insulating layer and connected to the first semiconductor layer through fifth and sixth contact holes.

According to some embodiments, each of the plurality of subpixels may include a driving transistor, and the driving transistor may include: a second light shielding layer disposed on the first sub-buffer layer of the upper buffer layer, a second semiconductor layer disposed on the third sub-buffer layer of the upper buffer layer and overlapping the second light shielding layer, a second gate electrode disposed on the second gate insulating layer and overlapping the second semiconductor layer and first and second electrodes disposed on the third interlayer insulating layer and connected to the second semiconductor layer through seventh and eighth contact holes.

According to some embodiments, the gate electrode of the first transistor may be disposed on the same layer as the first light shielding layer of the switching transistor and be made of the same metal material as that of the first light shielding layer, and the gate electrode of the second transistor may be disposed on the same layer as the second light shielding layer of the driving transistor and be made of the same metal material as that of the second light shielding layer.

According to some embodiments, the first light shielding layer of the switching transistor may be connected to the first gate electrode of the switching transistor, and the second light shielding layer of the driving transistor may be connected to the first electrode of the driving transistor.

According to some embodiments, the first semiconductor layer of the switching transistor and the second semiconductor layer of the driving transistor may include an oxide semiconductor layer disposed on the same layer as the oxide semiconductor layer of the second transistor.

According to some embodiments, each of the plurality of subpixels further may include a storage capacitor connected to the first electrode of the driving transistor, and the storage capacitor may include: a lower storage electrode disposed on the same layer as the first light shielding layer of the switching transistor and made of the same metal layer as that of the first light shielding layer, and an upper storage electrode disposed on the same layer as the second light shielding layer of the driving transistor, made of the same metal layer as that of the second light shielding layer and connected to the first electrode of the driving transistor through a contact hole.

According to some embodiments, the scan driver and each of the plurality of subpixels may include: a P-type transistor including a polysilicon semiconductor layer disposed on the same layer as the polysilicon semiconductor layer of the first transistor, and an N-type transistor including an oxide semiconductor layer disposed on the same layer as the oxide semiconductor layer of the second transistor.

A display panel according to some embodiments may comprise: a display area in which a plurality of subpixels are disposed, a first scan driver disposed in a bezel area, supplying a first scan signal to each of a plurality of first gate lines connected to the plurality of subpixels, a second scan driver disposed in the bezel area, supplying a second scan signal to each of a plurality of second gate lines connected to the plurality of subpixels, and a light emission control driver disposed in the bezel area, supplying a light emission control signal to each of a plurality of third gate lines connected to the plurality of subpixels, wherein at least one of the first and second scan drivers includes an inverter that inverts a carry signal generated from an input signal to output a corresponding scan signal. The inverter according to some embodiments includes a first transistor including a polysilicon semiconductor layer, and a second transistor including an oxide semiconductor layer, disposed to overlap the first transistor in a thickness direction of the display panel.

According to some embodiments, the first transistor may include a first electrode and a second electrode, which are connected to the polysilicon semiconductor layer, the second transistor includes a first electrode and a second electrode, which are connected to the oxide semiconductor layer, a gate electrode of the first transistor and a gate electrode of the second transistor, which overlap each other in the thickness direction, are connected to each other to constitute a common gate electrode that receives the carry signal, the first electrode of the first transistor is connected to a first power line to which a gate low voltage is supplied, the first electrode of the second transistor is connected to a second power line to which a gate high voltage is supplied, and the second electrode of the first transistor and the second electrode of the second transistor are integrally formed to constitute a common output line for outputting the corresponding scan signal.

According to some embodiments, a gate electrode of the first transistor may be disposed on the same layer as a first light shielding layer of a switching transistor included in each of the plurality of subpixels and be made of the same metal material as that of the first light shielding layer, and a gate electrode of the second transistor may be disposed on the same layer as a second light shielding layer of a driving transistor included in each of the plurality of subpixels and be made of the same metal material as that of the second light shielding layer.

According to some embodiments, a display panel includes a substrate, a light emitting element of at least one pixel on the substrate in a display area of the substrate, and a first semiconductor layer of a first transistor of an inverter on the substrate. The inverter is disposed in a gate driver area of the substrate. The display panel also includes a first gate insulating layer on the first semiconductor layer of the first transistor of the inverter, a first gate electrode of the first transistor of the inverter on the first gate insulating layer, an interlayer insulating layer on the first gate electrode of the first transistor, and a second gate electrode of a second transistor of the inverter on the interlayer insulating layer. The first gate electrode of the first transistor and the second gate electrode of the second transistor are electrically connected to each other. The display panel further includes a buffer layer on the second gate electrode of the inverter, a second semiconductor layer of the second transistor of the inverter and a third semiconductor layer of a third transistor of the at least one pixel on the buffer layer, a second gate insulating layer on the second semiconductor layer and the third semiconductor layer, and a third gate electrode of the third transistor on the second gate insulating layer.

According to some embodiments, the inverter is part of a scan driver configured to supply a scan signal to the third gate electrode of the third transistor of the at least one pixel.

According to some embodiments, the first transistor is electrically connected to a gate low voltage line, and the second transistor is electrically connected to a gate high voltage line.

According to some embodiments, the inverter is in a non-display area of the display panel, and the third transistor is in the display area of the display panel, in which an image is displayed.

According to some embodiments, the first semiconductor layer of the first transistor comprises polysilicon, and the second semiconductor layer of the second transistor comprises oxide semiconductor.

According to some embodiments, the third transistor is a switching transistor for the at least one pixel, the third transistor further comprises a light shielding layer on the first gate insulating layer, and the light shielding layer overlaps the third semiconductor layer of the third transistor.

According to some embodiments, the third transistor is a driving transistor for the at least one pixel, and the third transistor further comprises a light shielding layer on the interlayer insulating layer, and the light shielding layer overlaps the third semiconductor layer of the third transistor.

The gate driver having the inverter and the display panel according to one or more embodiments of the present disclosure may be applied to various electronic devices. For example, the gate driver having the inverter and the display panel according to one or more embodiments of the present disclosure may be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant (PDA), MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, and home appliances.

In addition to the above-mentioned advantageous effects of the present disclosure, other features and advantages of the present disclosure will be clearly understood by those skilled in the art from the above description or explanation. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display panel comprising:
a display area in which a plurality of subpixels are disposed;
a bezel area surrounding the display area; and
a scan driver disposed in the bezel area, supplying a scan signal to at least one gate line connected to each of the plurality of subpixels,
wherein the scan driver includes an inverter that inverts a carry signal generated from an input signal to output the scan signal,
the inverter includes:
a first transistor including a polysilicon semiconductor layer;
a second transistor including an oxide semiconductor layer, disposed to overlap the first transistor in a thickness direction of the display panel;
a gate electrode of the first transistor; and
a gate electrode of the second transistor, wherein the gate electrode of the first transistor and the gate electrode of the second transistor overlap each other in the thickness direction, and are connected to each other to constitute a common gate electrode that receives the carry signal.

2. The display panel of claim 1, wherein the first transistor includes a first electrode and a second electrode, each of which is connected to the polysilicon semiconductor layer,
the second transistor includes a first electrode and a second electrode, each of which is connected to the oxide semiconductor layer, and
the second electrode of the first transistor and the second electrode of the second transistor are electrically connected to each other to constitute a common output line for outputting the scan signal.

3. The display panel of claim 2, further comprising:
a substrate;
a lower buffer layer on the substrate;
a first gate insulating layer disposed on the lower buffer layer; and
a third interlayer insulating layer on the first gate insulating layer,
wherein the polysilicon semiconductor layer is disposed on the lower buffer layer,
the gate electrode of the first transistor is disposed to overlap the polysilicon semiconductor layer and the first gate insulating layer between the gate electrode of the first transistor and the polysilicon semiconductor layer, the first electrode and the second electrode of the first transistor are disposed on the third interlayer insulating layer and are connected to the polysilicon semiconductor layer through a first contact hole and a second contact hole respectively.

4. The display panel of claim 2, further comprising:
a first interlayer insulating layer covering the gate electrode of the first transistor; and
a first sub-buffer layer of an upper buffer layer disposed on the first interlayer insulating layer,
wherein a gate electrode of the second transistor is disposed to overlap the gate electrode of the first transistor.

5. The display panel of claim 4, further comprising:
a second sub-buffer layer;
a third sub-buffer layer on the second sub-buffer layer, the second sub-buffer layer and the third sub-buffer layer between the oxide semiconductor layer and the gate electrode of the second transistor; and
a third interlayer insulating layer on the third sub-buffer layer;
wherein the oxide semiconductor layer is disposed to overlap the gate electrode of the second transistor, and
wherein the first electrode and the second electrode of the second transistor are disposed on the third interlayer insulating layer and are connected to the oxide semiconductor layer through a third contact hole and a fourth contact hole.

6. The display panel of claim 5, wherein the inverter further includes:
a second gate insulating layer covering the oxide semiconductor layer; and
a second interlayer insulating layer disposed between the second gate insulating layer and the third interlayer insulating layer.

7. The display panel of claim 6, wherein the second transistor further includes an upper gate electrode disposed on the second gate insulating layer to overlap the oxide semiconductor layer and connected to the gate electrode of the second transistor.

8. The display panel of claim 6, wherein each of the plurality of subpixels includes a switching transistor, and the switching transistor includes:
a first light shielding layer disposed on a first gate insulating layer;
a first semiconductor layer disposed on the upper buffer layer and overlapping the first light shielding layer;
a first gate electrode disposed on the second gate insulating layer and overlapping the first semiconductor layer; and
a first electrode and a second electrode disposed on the third interlayer insulating layer and connected to the first semiconductor layer through a fifth contact hole and a sixth contact hole respectively.

9. The display panel of claim 8, wherein each of the plurality of subpixels includes a driving transistor, and the driving transistor includes:
a second light shielding layer disposed on the first sub-buffer layer of the upper buffer layer;
a second semiconductor layer disposed on the third sub-buffer layer of the upper buffer layer and overlapping with the second light shielding layer;
a second gate electrode disposed on the second gate insulating layer and overlapping the second semiconductor layer; and a first electrode and a second electrode disposed on the third interlayer insulating layer and connected to the second semiconductor layer through a seventh contact hole and an eighth contact hole respectively.

10. The display panel of claim 9, wherein the gate electrode of the first transistor is disposed on a same layer as the first light shielding layer of the switching transistor and is made of a same metal material as that of the first light shielding layer, and
the gate electrode of the second transistor is disposed on a same layer as the second light shielding layer of the driving transistor and is made of a same metal material as that of the second light shielding layer.

11. The display panel of claim 9, wherein the first light shielding layer of the switching transistor is connected to the first gate electrode of the switching transistor, and
the second light shielding layer of the driving transistor is connected to the first electrode of the driving transistor.

12. The display panel of claim 9, wherein the first semiconductor layer of the switching transistor and the second semiconductor layer of the driving transistor include an oxide semiconductor layer disposed on a same layer as the oxide semiconductor layer of the second transistor.

13. The display panel of claim 9, wherein each of the plurality of subpixels further includes a storage capacitor connected to the first electrode of the driving transistor, and the storage capacitor includes:
a lower storage electrode disposed on a same layer as the first light shielding layer of the switching transistor and made of a same metal layer as that of the first light shielding layer; and
an upper storage electrode disposed on a same layer as the second light shielding layer of the driving transistor, made of a same metal layer as that of the second light shielding layer and connected to the first electrode of the driving transistor through a contact hole.

14. The display panel of claim 2, wherein the first transistor is a P-type transistor, and
the second transistor is an N-type transistor.

15. The display panel of claim 14, wherein the first electrode of the first transistor is connected to a second power line to which a gate high voltage is supplied, and
the first electrode of the second transistor is connected to a first power line to which a gate low voltage is supplied.

16. The display panel of claim 1, wherein a channel width of the oxide semiconductor layer is smaller than a channel width of the polysilicon semiconductor layer.

17. The display panel of claim 1, wherein the scan driver and each of the plurality of subpixels include:
a P-type transistor including a polysilicon semiconductor layer disposed on a same layer as the polysilicon semiconductor layer of the first transistor; and
an N-type transistor including an oxide semiconductor layer disposed on a same layer as the oxide semiconductor layer of the second transistor.

18. A display panel comprising:
a display area in which a plurality of subpixels are disposed;
a bezel area surrounding the display area;
a plurality of first gate lines connected to the plurality of subpixels;
a plurality of second gate lines connected to the plurality of subpixels;
a plurality of third gate lines connected to the plurality of subpixels;

a first scan driver disposed in the bezel area, supplying a first scan signal to each of the plurality of first gate lines;

a second scan driver disposed in the bezel area, supplying a second scan signal to each of the plurality of second gate lines; and a light emission control driver disposed in the bezel area, supplying a light emission control signal to each of the plurality of third gate lines, wherein at least one of the first scan driver and the second scan driver includes an inverter that inverts a carry signal generated from an input signal to output a corresponding scan signal, the inverter includes:

a first transistor including a polysilicon semiconductor layer; and a second transistor including an oxide semiconductor layer, disposed to overlap the first transistor in a thickness direction of the display panel.

19. The display panel of claim 18, wherein the first transistor includes a first electrode and a second electrode, each of which is connected to the polysilicon semiconductor layer, the second transistor includes a first electrode and a second electrode, each of which is connected to the oxide semiconductor layer, a gate electrode of the first transistor and a gate electrode of the second transistor overlap each other in the thickness direction, and are connected to each other to constitute a common gate electrode that receives the carry signal, the first electrode of the first transistor is connected to a first power line to which a gate high voltage is supplied, the first electrode of the second transistor is connected to a second power line to which a gate low voltage is supplied, and the second electrode of the first transistor and the second electrode of the second transistor are integrally formed to constitute a common output line for outputting the corresponding scan signal.

20. The display panel of claim 18, wherein a gate electrode of the first transistor is disposed on a same layer as a first light shielding layer of a switching transistor included in each of the plurality of subpixels and is made of a same metal material as that of the first light shielding layer, and a gate electrode of the second transistor is disposed on a same layer as a second light shielding layer of a driving transistor included in each of the plurality of subpixels and is made of a same metal material as that of the second light shielding layer.

21. A display panel, comprising:
a substrate;
a light emitting element of at least one pixel on the substrate in a display area of the substrate;
a first semiconductor layer of a first transistor of an inverter on the substrate, wherein the inverter is disposed in a gate driver area of the substrate;
a first gate insulating layer on the first semiconductor layer of the first transistor of the inverter;
a first gate electrode of the first transistor of the inverter on the first gate insulating layer;
an interlayer insulating layer on the first gate electrode of the first transistor;
a second gate electrode of a second transistor of the inverter on the interlayer insulating layer, wherein the first gate electrode of the first transistor and the second gate electrode of the second transistor are electrically connected to each other, and
a buffer layer on the second gate electrode of the inverter;
a second semiconductor layer of the second transistor of the inverter and a third semiconductor layer of a third transistor of the at least one pixel on the buffer layer;
a second gate insulating layer on the second semiconductor layer and the third semiconductor layer; and
a third gate electrode of the third transistor on the second gate insulating layer.

22. The display panel of claim 21, wherein the inverter is part of a scan driver configured to supply a scan signal to the third gate electrode of the third transistor of the at least one pixel.

23. The display panel of claim 21, wherein the first transistor is electrically connected to a gate high voltage line, and the second transistor is electrically connected to a gate low voltage line.

24. The display panel of claim 21, wherein the inverter is in a non-display area of the display panel, and the third transistor is in the display area of the display panel, in which an image is displayed.

25. The display panel of claim 21, wherein the first semiconductor layer of the first transistor comprises polysilicon, and the second semiconductor layer of the second transistor comprises oxide semiconductor.

26. The display panel of claim 21, wherein the third transistor is a switching transistor for the at least one pixel, and the third transistor further comprising a light shielding layer on the first gate insulating layer, the light shielding layer overlapping the third semiconductor layer of the third transistor.

27. The display panel of claim 21, wherein the third transistor is a driving transistor for the at least one pixel, and the third transistor further comprising a light shielding layer on the interlayer insulating layer, the light shielding layer overlapping the third semiconductor layer of the third transistor.

* * * * *